(12) United States Patent
Jimbo et al.

(10) Patent No.: US 7,135,751 B2
(45) Date of Patent: Nov. 14, 2006

(54) HIGH BREAKDOWN VOLTAGE JUNCTION TERMINATING STRUCTURE

(75) Inventors: Shinichi Jimbo, Nagano (JP); Tatsuhiko Fujihira, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 10/896,323

(22) Filed: Jul. 21, 2004

(65) Prior Publication Data

US 2005/0056906 A1   Mar. 17, 2005

(30) Foreign Application Priority Data

Jul. 25, 2003   (JP) .............................. 2003-201998

(51) Int. Cl.
*H01L 23/58* (2006.01)
(52) U.S. Cl. ....................... 257/492; 257/491; 257/487; 257/493
(58) Field of Classification Search ...................... None
See application file for complete search history.

(56) References Cited

U.S. PATENT DOCUMENTS

| 5,801,418 A | 9/1998 | Ranjan ......................... 257/336 |
| 6,124,628 A | 9/2000 | Fujihira et al. .............. 257/630 |

FOREIGN PATENT DOCUMENTS

| JP | 2002-33382 A | 1/2002 |
| JP | 2002-83935 A | 3/2002 |
| JP | 2002-118234 A | 4/2002 |
| JP | 2002-246551 A | 8/2002 |
| JP | 2003-17503 A | 1/2003 |
| JP | 2003-17704 A | 1/2003 |

OTHER PUBLICATIONS

Fujihira et al., "Self-shielding: New High-Voltage Inter-Connection Technique for HVICs", IEEE,0-7803-3106-0, 1996, pp. 231-234, (Reference submitted in IDS of Jul. 21, 2004).*
T. Fujihira et al.; "Self-shielding: New High-Voltage Inter-Connection Technique for HVICs"; IEEE, 0-7803-3106-0, 1996; pp. 231-234.

* cited by examiner

*Primary Examiner*—Nathan J. Flynn
*Assistant Examiner*—Scott R. Wilson
(74) *Attorney, Agent, or Firm*—Rossi, Kimms & McDowell, LLP

(57) ABSTRACT

A high breakdown voltage junction terminating structure having a loop-like RESURF structure formed on a SOI substrate is disclosed. A lateral IGBT, a lateral FWD, an output stage element and a driving circuit are formed in the inside region of the structure. The lateral IGBT and the lateral FWD are surrounded by a trench isolation region as an insulation region. Drain electrodes of high breakdown voltage NMOSFETs are provided on the inside of the high breakdown voltage junction terminating structure. Along with this, a gate electrode and a source electrode of each of the NMOSFETs are provided on the outside of the high breakdown voltage junction terminating structure. The periphery of the high breakdown voltage junction terminating structure is surrounded by a trench isolation region as a second insulation region. A control circuit is provided on the outside of the second insulation region. With this structure, a high breakdown voltage semiconductor device is obtained at low cost, in which power elements, circuits for driving the power elements and logic elements for controlling the power elements are integrated together into the same chip.

12 Claims, 13 Drawing Sheets

HIGH BREAKDOWN VOLTAGE JUNCTION TERMINATING STRUCTURE

CROSS REFERENCE TO RELATED APPLICATIONS

This application claims priority from Japanese application no. JP PA 2003-201998, filed on Jul. 25, 2003, and the contents of this document are incorporated herein by reference in its entirety.

BACKGROUND OF THE INVENTION

A. Field of the Invention

The present invention relates to a semiconductor device such as a high breakdown voltage IC (integrated circuit) in which high breakdown voltage lateral semiconductor elements and low breakdown voltage semiconductor elements for controlling are integrated together on the same substrate by applying a dielectric isolation technique thereto. In particular, the invention relates to a semiconductor device forming a one-chip inverter in which lateral IGBTs (insulated gate bipolar transistors) and lateral FWDs (free wheeling diodes) are mounted on the same substrate together with driving circuits of the respective IGBTs, a control circuit and a level shift circuit.

B. Description of the Related Art

In recent years, in high breakdown voltage semiconductor devices, a high breakdown voltage power IC has been developed in which power switching elements such as IGBTs and circuits for driving, controlling and protecting the IGBTs are integrated together on one semiconductor substrate. An element isolation technique such as that of junction isolation or dielectric isolation is used to mutually isolate the elements in such a high breakdown voltage power IC.

In a structure using dielectric isolation, capacitance per unit area in an isolated region is much smaller than that for a structure in which junction isolation is used. Thus, the structure has an advantage of hardly causing damage or malfunction of the semiconductor device due to latch-up induced by a parasitic element. In addition, a dielectric isolation structure can eliminate generation of a leak current caused by light irradiation under an environment of a strong radiation, which occurs in an element with a junction isolation structure.

Because of the above advantage of a dielectric isolation structure, a one-chip inverter is developed by using a dielectric isolation technique. In the one-chip inverter, lateral IGBTs and lateral FWDs are mounted together on the same substrate with a control element for controlling the IGBTs and the FWDs. The advantage of the one-chip inverter over a conventional structure in which power element chips and control element chips are separately provided is that an inverter device can be miniaturized with a considerable reduction in chip surface mounting areas and is highly reliable because of the reduction in the number of electrical connections between chips with bonding wires.

In FIG. 9, an arrangement of a general inverter circuit is shown. As shown in FIG. 9, a power device used for driving an electrical machine (not shown) such as a three-phase motor is made up of six IGBTs (Q1, Q2, Q3, Q4, Q5 and Q6) and six FWDs (D1, D2, D3, D4, D D6) connected in parallel to the respective IGBTs, with which a bridge circuit is formed. Anodes of the FWDs D1, D2, D3, D4, D5 and D6 are connected to emitters of the IGBTs of Q1, Q2, Q3, Q4, Q5 and Q6, respectively. Cathodes of the FWDs are connected to collectors of the respective IGBTs.

A direct-current voltage is applied between collectors of the IGBTs Q1, Q2 and Q3, upper arm switching elements in the U-phase, the V-phase and the W-phase, respectively, and emitters of the IGBTs Q4, Q5 and Q6, lower arm switching elements in the U-phase, the V-phase and the W-phase, respectively. The direct-current voltage is obtained by an AC power source 1, a converter 2 and a capacitor C.

Gates of the IGBTs Q1, Q2 and Q3 on the upper arm side are connected to corresponding output stage elements 3a, 3b and 3c, respectively. Gates of the IGBTs Q4, Q5 and Q6 on the lower arm side are connected to respective corresponding output stage elements (not shown) provided in control circuit 4. In other word, the IGBTs Q1, Q2, Q3, Q4, Q5 and Q6 are turned on and off on the basis of output signals from the respective corresponding output stage elements. In FIG. 9, in order to avoid making the figure complicated, illustration of connection between each gate and a corresponding output stage element is omitted.

A control signal for determining which ones of the IGBTs Q1, Q2, Q3, Q4, Q5 and Q6 are turned on and which ones are turned off is transmitted from control circuit 4 on the basis of a signal supplied from a microcomputer (not shown). Control signals for the IGBTs Q1, Q2 and Q3 on the upper arm side are subjected to voltage adjustment by level shift circuit 5 before being supplied to output stage elements 3a, 3b and 3c through driving circuits 6a, 6b and 6c corresponding thereto, respectively. Control signals for the IGBTs Q4, Q5 and Q6 on the lower arm side are supplied to their illustration-omitted respective output stage elements through their respective corresponding driving circuits (not shown) provided in control circuit 4.

FIG. 10 is a plan view schematically showing an arrangement of a principal part for the upper arm of the U-phase in a related one-chip inverter. As shown in FIG. 10, in the related one-chip inverter (a part of the upper arm for the U-phase) 10, on a SOI (silicon on insulator) substrate, there are formed control circuit 11 that outputs a control signal to a driving circuit for each of the U-phase, the V-phase and the W-phase on the basis of an input signal, high breakdown voltage NMOSFETs (N-channel insulated gate field effect transistors each using an oxide film as a gate insulator film) 12a and 12b each forming a level shift element in a level shift circuit, lateral IGBT 13 as a switching element on the U-phase upper arm, lateral FWD 14 connected in parallel to lateral IGBT 13, output stage element 15 supplying a switching signal to lateral IGBT 13, and driving circuit 16 producing an output signal to output stage element 15 on the basis of signals supplied from drain electrodes 17a and 17b of the high breakdown voltage NMOSFETs 12a and 12b (level shift elements) through wires 18a and 18b, respectively.

A region for forming each of the circuits and the elements is separated from others by trench isolation region 19. FIG. 10, however, only shows circuits relating to the key functions of the inverter without showing protection circuits included in the driving circuit and the control circuit, and circuits having other functions (the same is true for any other figures). Moreover, in some cases, for the level shift element, instead of the high breakdown voltage NMOSFET for a level-up circuit, a high breakdown voltage PMOSFET (P-channel MOSFET) for a level-down circuit is mounted.

FIG. 11 is a vertical cross sectional view taken on line G–G' in FIG. 10 showing a cross sectional structure of high breakdown voltage NMOSFET 12a (level shift element). As shown in FIG. 11, SOI substrate 20 has a structure in which first semiconductor substrate 21 as a supporting substrate, and second semiconductor substrate 23 as a semiconductor layer in which element structures are formed, are layered with oxide film 22 as an insulator layer in between. Drain electrode 17a of the high breakdown voltage NMOSFET 12a is provided at the center of the high breakdown voltage NMOSFET 12a. High breakdown voltage junction terminating structure 24 is formed around drain electrode 17a, and is made up of a RESURF (reduced surface field) structure such as a double RESURF or a single RESURF.

Gate electrode 25 and source electrodes 26a and 26b of the high breakdown voltage NMOSFET 12a are formed in a part of the peripheral section of high breakdown voltage junction terminating structure 24. P-diffused layers 27a and 27b are provided on the surface of high breakdown voltage junction terminating structure 24 to achieve a high breakdown voltage by a RESURF effect. Trench isolation region 19 is provided around high breakdown voltage NMOSFET 12a. Oxide film 28 is formed on each side wall of trench isolation region 19. An inside part between oxide films 28 is filled with polycrystalline silicon 29.

As shown in FIG. 11, in a related one-chip inverter, wire 18a connected to drain electrode 17a of high breakdown voltage NMOSFET 12a traverses over high breakdown voltage junction terminating structure 24. This causes an area between wire 18a and second semiconductor substrate 23 to which a high voltage of the order of 600V, for example, is applied. Therefore, interlayer insulator film 30 such as an oxide film provided between high voltage wire 18a and second semiconductor substrate 23 must be thick enough. Thin interlayer insulator film 30 causes an electric potential of high voltage wire 18a to affect an electric potential distribution in the substrate, which results in degradation in a breakdown voltage of high breakdown voltage NMOSFET 12a. Furthermore, possible breakdown of interlayer insulator film 30 is caused at a sudden increase in the electric potential of drain electrode 17a.

The same is true for an interlayer insulator film provided between wire 18b, connected to drain electrode 17b of the other high breakdown voltage NMOSFET 12b shown in FIG. 10, and second semiconductor substrate 23. Moreover, the same is also true about a part for the upper arm of the V-phase and a part for the upper arm of the W-phase that have the same arrangement as that of the above-described part for the upper arm of the U-phase.

The inventors previously reported that use of a self-shielding technique eliminates the structure, in which a wire at a high electric potential traverses over a substrate at the ground (GND) level with an insulator in between, to thereby make it possible to actualize an IC with a high breakdown voltage of 1000V or more (see Fujihira et al., "Self-shielding: New High-Voltage Inter-Connection Technique for HVICs," *Proc. 8th Int. Symp. Power Semiconductor Devices and ICs, Maui, 1996, IEEE* (1996), pp 231–234). Various proposals are presented about the self-shielding technique (see, for example, Japanese Patent No.3,214,818, JP-A-9-55498 and U.S. Pat. No. 6,124,628).

FIG. 12 is a plan view schematically showing an arrangement of a principal part for an upper arm of the U-phase in a related inverter device in which the self-shielding technique is applied to a multi-chip arrangement. As shown in FIG. 12, control circuit 11, output stage element 15 and driving circuit 16 are formed into high breakdown voltage IC chip 31. IGBT 32 and FWD 33 are formed into their respective chips different from high breakdown voltage IC chip 31.

Output stage element 15 and driving circuit 16 are formed in a region surrounded by high breakdown voltage junction terminating structure 34 made up of a loop-like RESURF structure in high breakdown voltage IC chip 31. Output stage element 15 is electrically connected to gate electrode 35 and emitter electrode 36 of IGBT 32 through bonding wires 37 and 38, respectively.

FIG. 13 is a vertical cross sectional view taken on line H–H' in FIG. 12, which view shows a cross sectional structure of high breakdown voltage NMOSFET 12a as a level shift element. As shown in FIG. 13, drain electrode 17a of high breakdown voltage NMOSFET 12a is formed at one end of high breakdown voltage junction terminating structure 34. At the other end of high breakdown voltage junction terminating structure 34, gate electrode 25 and source electrodes 26a and 26b of high breakdown voltage NMOSFET 12a are formed. A cross sectional structure of the other high breakdown voltage NMOSFET 12b is the same as that shown in FIG. 13. A structure of a part for the upper arm of the V-phase and a structure of a part for the upper arm of the W-phase are the same as the structure of the part for the upper arm of the U-phase.

As explained above, in the related one-chip inverter, thick interlayer insulator film 30 is necessary between high voltage wire 18a and second semiconductor substrate 23. However, there is a limit to the thickness of the insulator film such as an oxide film that can be formed on the substrate in respect to manufacturing cost. The thickness of an interlayer insulator film put to practical use under the present situation is of the order of 6 μm in a one-chip inverter with a 600V breakdown voltage. Compared with this, realization of a one-chip inverter of 1200V breakdown voltage class with the same structure as that of one with the 600V breakdown voltage necessitates that the interlayer insulator film under the high voltage wire be formed with a thickness exceeding 10 μm for ensuring high reliability. This makes it difficult to produce the chips at low cost.

The present invention was made in view of the above problem with an object of providing a high breakdown voltage semiconductor device at low cost in which device power elements and a driving circuit for driving the elements are integrated together in the same chip. A semiconductor device in which logic elements for controlling the power elements are also integrated together in the above chip. The present invention is directed to overcoming, or at least reducing, the effects of one or more of the problems set forth above.

SUMMARY OF THE INVENTION

In order to achieve these and other objects, a semiconductor device according to the invention includes a supporting substrate; an insulator layer layered on the supporting substrate; a semiconductor layer layered on the insulator layer; a high breakdown voltage junction terminating structure having a RESURF (reduced surface field) structure formed in a loop-like shape on a surface region of the semiconductor layer; a power element formed in a region surrounded by the high breakdown voltage junction terminating structure; a driving unit for the power element formed in the region surrounded by the high breakdown voltage junction terminating structure; an insulation region surrounding the power element in the region surrounded by the high breakdown voltage junction terminating structure and penetrating through the semiconductor layer to reach the insulator layer; a level shift element having an input electrode, to which a voltage before level shift is applied, and an output electrode, to which a voltage after level shift is applied, the input electrode being disposed on one side of the high breakdown voltage junction terminating structure and the output electrode being disposed on the other side of the high breakdown voltage junction terminating structure with the high breakdown voltage junction terminating structure arranged between the input electrode and the output electrode; a wire electrically connecting the output electrode of the level shift element and the driving unit; and an interlayer insulator film provided between the semiconductor layer and the wire.

In one embodiment, the driving unit is positioned between the high breakdown voltage junction terminating structure and the insulation region. The driving unit may be surrounded by the insulation region. The driving unit may comprise one of an N-channel insulated gate field-effect transistor and a P-channel insulated gate field-effect transistor, or it may comprise both an N-channel insulated gate field-effect transistor and a P-channel insulated gate field-effect transistor.

The level shift element may be made up of a high breakdown voltage insulated gate field-effect transistor having a drain electrode as the output electrode on one side of the high breakdown voltage junction terminating structure, and a gate electrode and a source electrode as the input electrode on the other side, with the high breakdown voltage junction terminating structure positioned between the drain electrode and both of the gate electrode and the source electrode.

The power element may comprise one of an insulated gate bipolar transistor and a diode, or may comprise both an insulated gate bipolar transistor and a diode.

The device may further comprise logic element in an outer region of the high breakdown voltage junction terminating structure on the semiconductor layer. The logic element may comprise one of an N-channel insulated gate field-effect transistor and a P-channel insulated gate field-effect transistor, or it may comprise both an N-channel insulated gate field-effect transistor and a P-channel insulated gate field-effect transistor.

In one embodiment, the device further comprises a second insulation region surrounding the high breakdown voltage junction terminating structure and penetrating through the semiconductor layer to reach the insulator layer.

According to the invention, by applying the self-shield technique thereto, the level shift element is formed so as to spread over the inside and the outside of the high breakdown voltage junction terminating structure. Thus, the wire at a high electric potential connected to the level shift element is connected to the driving unit without traversing the semiconductor layer at the ground (GND) level. Therefore, there is no necessity to provide a thick interlayer insulator film on the semiconductor layer. Moreover, dielectric isolation of the power element, which isolation is provided by the insulation region in the inside region of the high breakdown voltage junction terminating structure, can prevent operation of a parasitic element that occurs between the power element and elements taking the ground (GND) level on the outside of the high breakdown voltage junction terminating structure as the reference electric potential thereof.

In the invention, the driving unit can be provided between the high breakdown voltage junction terminating structure and the insulation region. Moreover, an arrangement can be provided which includes a second insulation region surrounding the high breakdown voltage junction terminating structure and penetrating through the semiconductor layer to reach the insulator layer. Alternatively, an arrangement can be provided in which the driving unit is surrounded by the insulation region. With such arrangements, the operation of the parasitic element can be inhibited more to make it possible to enhance the reliability of the device.

Moreover, in the above invention, the level shift element can be made up of a high breakdown voltage MOSFET (insulated gate field-effect transistor) having a drain electrode to be the output electrode on one side of the high breakdown voltage junction terminating structure, and on the other side thereof, having a gate electrode and a source electrode to be the input electrode with the high breakdown voltage junction terminating structure arranged between the drain electrode and both of the gate electrode and the source electrode. Furthermore, one or both of an IGBT (insulated gate bipolar transistor) and an FWD (free wheeling diode) can be formed as the power element. In addition, one or both of an NMOSFET and a PMOSFET can be formed for the driving unit. With this, a one-chip inverter with the power element and the driving unit being integrated together can be obtained at low cost, which hardly causes damage and malfunction due to an operation of a parasitic element and has a high breakdown voltage exceeding 1000V.

Furthermore, in the above invention, a logic element can be provided in an outer region of the high breakdown voltage junction terminating structure on the semiconductor layer. As the logic element, one or both of an N-channel insulated gate field-effect transistor and a P-channel insulated gate field-effect transistor can be formed. With this, a one-chip inverter with the power element (IGBT and FWD), and the driving unit and the control circuit therefor being integrated together can be obtained at low cost, which hardly causes damage and malfunction due to an operation of a parasitic element and has a high breakdown voltage exceeding 1000V.Paragraph 1

Furthermore, in the above invention, a second semiconductor layer can be formed on the semiconductor layer between the input electrode and the output electrode, and the input electrode and the output electrode can be extended over the second semiconductor layer and can be used both as a field plate of the level shift element and the electrodes. Thereby the concentration of the electric field in the level shift element can be relaxed since the field plate exists.

BRIEF DESCRIPTION OF THE DRAWINGS

The foregoing advantages and features of the invention will become apparent upon reference to the following detailed description and the accompanying drawings.

DETAILED DESCRIPTION OF SPECIFIC EMBODIMENTS

In the following, embodiments of the invention will be explained in detail with reference to the drawings. In each of the embodiments, an example is given in which the invention is applied to a three-phase inverter in a one-chip arrangement and an explanation thereof will be given about an arrangement of a part for an upper arm of the U-phase of the one-chip inverter. An arrangement of a part for an upper arm of each of the rest V-phase and W-phase is the same as that of the U-phase. Therefore the explanation thereof will be omitted.

Embodiment 1

Figure 1:
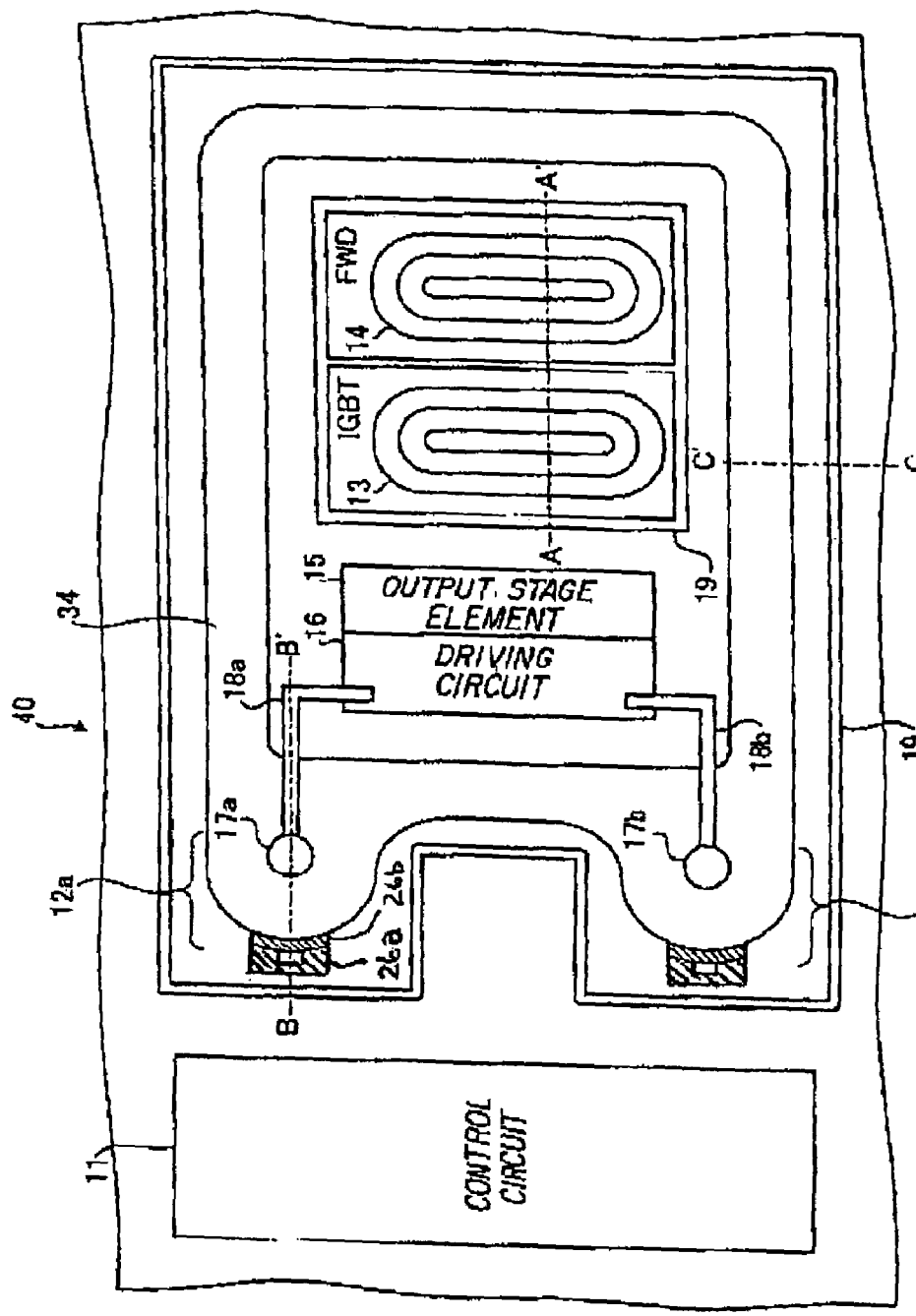
FIG. 1 is a plan view schematically showing an arrangement of a principal part for an upper arm of the U-phase in a one-chip inverter according to the embodiment 1 of the invention.

FIG. 1 is a plan view schematically showing an arrangement of a principal part for the upper arm of the U-phase in a one-chip inverter according to embodiment 1 of the invention. In embodiment 1, the same constituents as those shown in FIG. 10 to FIG. 13 are designated by the same reference numerals and signs, with repetition of explanation thereof being omitted.

As shown in FIG. 1, in the one-chip inverter (the part for the upper arm of the U-phase) 40 of embodiment 1, control circuit 11 including logic elements, high breakdown voltage NMOSFETs 12a and 12b as level shift elements, lateral IGBT 13 and lateral FWD 14 as power elements, and output stage element 15 and driving circuit 16 both forming a driving unit are formed on the same substrate. The substrate is SOI substrate 20 (see FIG. 2 to FIG. 4), which is made up of first semiconductor 21, oxide film 22 and second semiconductor substrate 23.

Lateral IGBT 13, lateral FWD 14, output stage element 15 and driving circuit 16 are formed in a region surrounded by high breakdown voltage junction terminating structure 34 having a loop-like RESURF structure. Furthermore, lateral IGBT 13 and lateral FWD 14 are formed in their respective element forming regions, each of which is surrounded by trench isolation region 19 as an insulation region. Output stage element 15 and driving circuit 16 are formed in a region between high breakdown voltage junction terminating structure 34 and trench isolation region 19.

High breakdown voltage NMOSFET 12a and 12b are formed so as to spread over the inside and the outside of high breakdown voltage junction terminating structure 34. Drain electrodes 17a and 17b of high breakdown voltage NMOSFET 12a and 12b are electrically connected to driving circuit 16 through wires 18a and 18b, respectively. Moreover, high breakdown voltage junction terminating structure 34 is surrounded by trench isolation region 19 as a second insulation region formed in a loop-like shape. Control circuit 11 is provided on the outside of trench isolation region 19 as the second insulation region.

Figure 2:
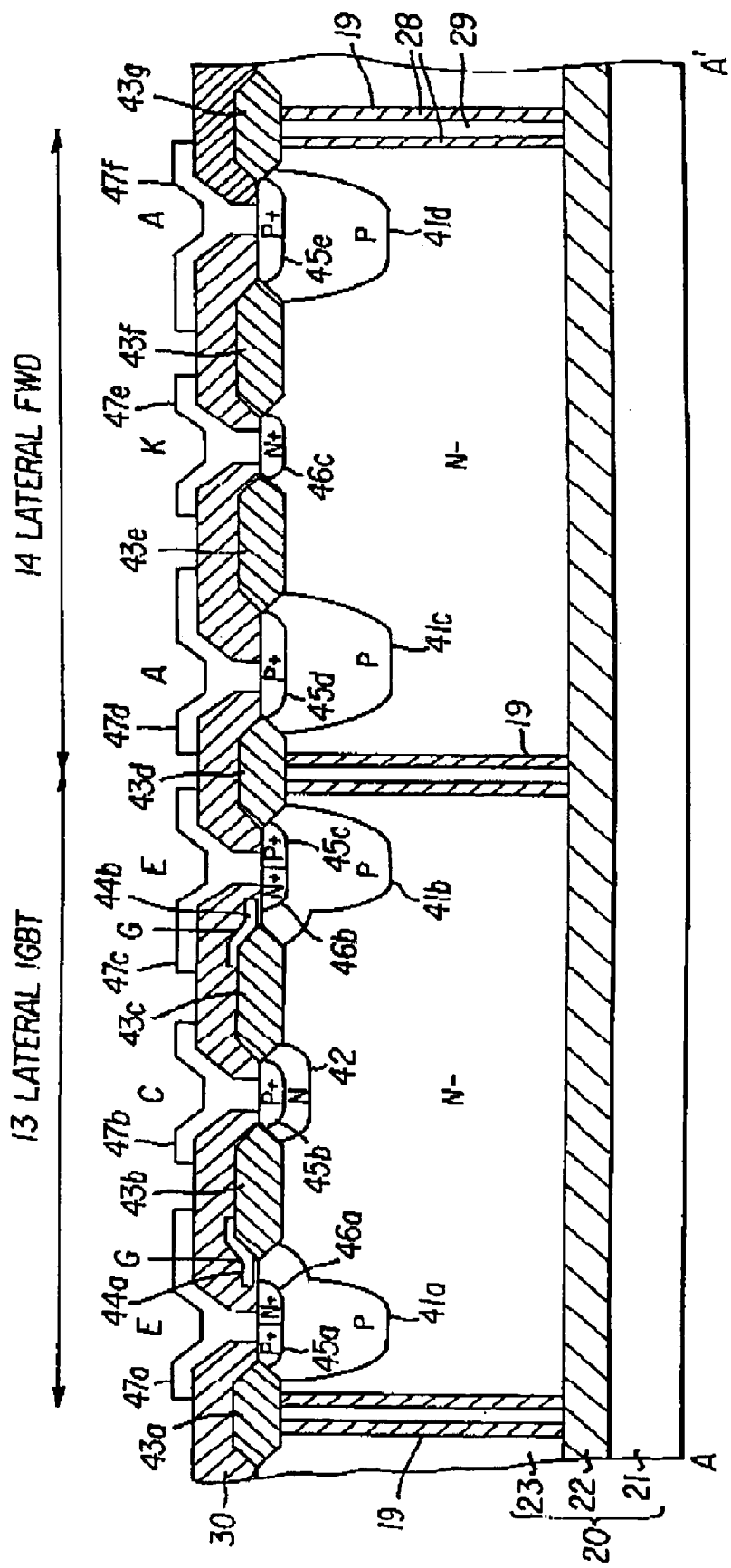
FIG. 2 is a vertical cross sectional view showing a cross sectional structure taken on line A–A' in FIG. 1.

FIG. 2 is a vertical cross sectional view taken on line A–A' in FIG. 1, showing cross sectional structures of lateral IGBT 13 and lateral FWD 14. As shown in FIG. 2, trench isolation region 19 penetrates second semiconductor substrate (N-type) 23 of SOI substrate 20 to reach oxide film 22 of SOI substrate 20. Lateral IGBT 13 and lateral FWD 14 are formed in element forming regions different from each other, each being surrounded by trench isolation region 19 and oxide film 22 of SOI substrate 20. In the following, for convenience of explanation, the element forming region in which lateral IGBT 13 is formed is referred to as an IGBT forming region, and the element forming region in which lateral FWD 14 is formed is referred to as an FWD forming region.

In the IGBT forming region, P-well regions 41a and 41b are selectively formed on the surface layer of second semiconductor substrate 23. On the surface of P-well region 41a, P+-contact region 45a and N+-emitter region 46a are formed, and on the surface of P-well region 41b, P+-contact region 45c and N+-emitter region 46b are formed. Emitter electrode 47a is electrically connected to P+-contact region 45a and N+-emitter region 46a, and emitter electrode 47c is electrically connected to P+-contact region 45c and N+-emitter region 46b.

Moreover, in the IGBT forming region, N-buffer region 42 is selectively formed on the surface layer of semiconductor substrate 23. P+-collector region 45b is formed on the surface of N-buffer region 42. Collector electrode 47b is electrically connected to P+-collector region 45b. Gate electrodes 44a and 44b are formed on P-well regions 41a and 41b with gate insulator films (not shown) in between, respectively.

P-diffused regions 41c and 41d are selectively formed on the surface layer of the second semiconductor substrate 23 in the FWD forming region. P+-anode regions 45d and 45e are formed on the surfaces of P-diffused regions 41c and 41d, respectively. Anode electrodes 47d and 47f are electrically connected to P+-anode regions 45d and 45e, respectively. N+-cathode region 46c is selectively formed on the surface layer of second semiconductor substrate 23. Cathode electrode 47e is electrically connected to N+-cathode region 46c.

Each of thermal oxide films 43a, 43d and 43g for element isolation is provided on each trench isolation region 19. Moreover, thermal oxide layer 43b is also provided between P-well region 41a and N-buffer region 42, and thermal oxide film 43c is also provided between P-well region 41b and N-buffer region 42. Furthermore, thermal oxide layer 43e is also provided between P-diffused region 41c and N+-cathode region 46c, and thermal oxide film 43f is also provided between P-diffused region 41d and N+-cathode region 46c. Although its illustration is omitted, an interlayer insulator film of a material such as BPSG (borophosphosilicate glass) is provided on thermal oxide films 43a, 43b, 43c, 43d, 43e, 43f and 43g, and gate electrodes 44a and 44b.

An explanation will be given about a method of forming lateral IGBT 13 and lateral FWD 14 both being arranged as shown in FIG. 2. First, N-type second semiconductor substrate 23 is laminated onto N-type or P-type first semiconductor substrate 21, with oxide film 22 in between, to thereby form SOI substrate 20. Then, the trench reaching oxide film 22 from the surface of second semiconductor substrate 23 is formed to thereby divide second semiconductor substrate 23 into a plurality of element forming regions. Following this, oxide film 28 is formed on the surface of the trench. Furthermore, the inside of the trench is filled with polycrystalline silicon 29 to thereby form trench isolation region 19.

Next to this, P-well regions 41a and 41b are formed on the surface of the IGBT forming region of second semiconductor substrate 23. Moreover, P-diffused regions 41c and 41d are formed on the surface of the FWD forming region of second semiconductor substrate 23. Furthermore, N-buffer region 42 is formed on the surface of the IGBT forming region. Then, thermal oxide films 43a, 43b, 43c, 43d, 43e, 43f and 43g are formed on the surface of second semiconductor substrate 23. After this, gate insulator films (not shown) are formed on P-well regions 41a and 41b. Gate electrodes 44a and 44b made of polycrystalline silicon are formed on the gate insulators films, respectively.

Following this, P+-contact regions 45a and 45c and P+-collector region 45b of lateral IGBT 13, and P+-anode region 45d and 45e of lateral FWD 14 are formed. After this, N+-emitter regions 46a and 46b of lateral IGBT 13 and N+-cathode region 46c of lateral FWD 14 are formed. Then, after the interlayer insulator film (not shown) of a material such as BPSG (borophosphosilicate glass) is formed on the surface, openings are provided in the interlayer insulator film to allow contact with the semiconductor substrate. Subsequent to this, emitter electrodes 47a and 47c and collector electrode 47b of lateral IGBT 13 and anode electrodes 47d and 47f and cathode electrode 47e of lateral FWD 14 are formed in the respective openings, by which lateral IGBT 13 and lateral FWD 14 are completed.

Figure 3:
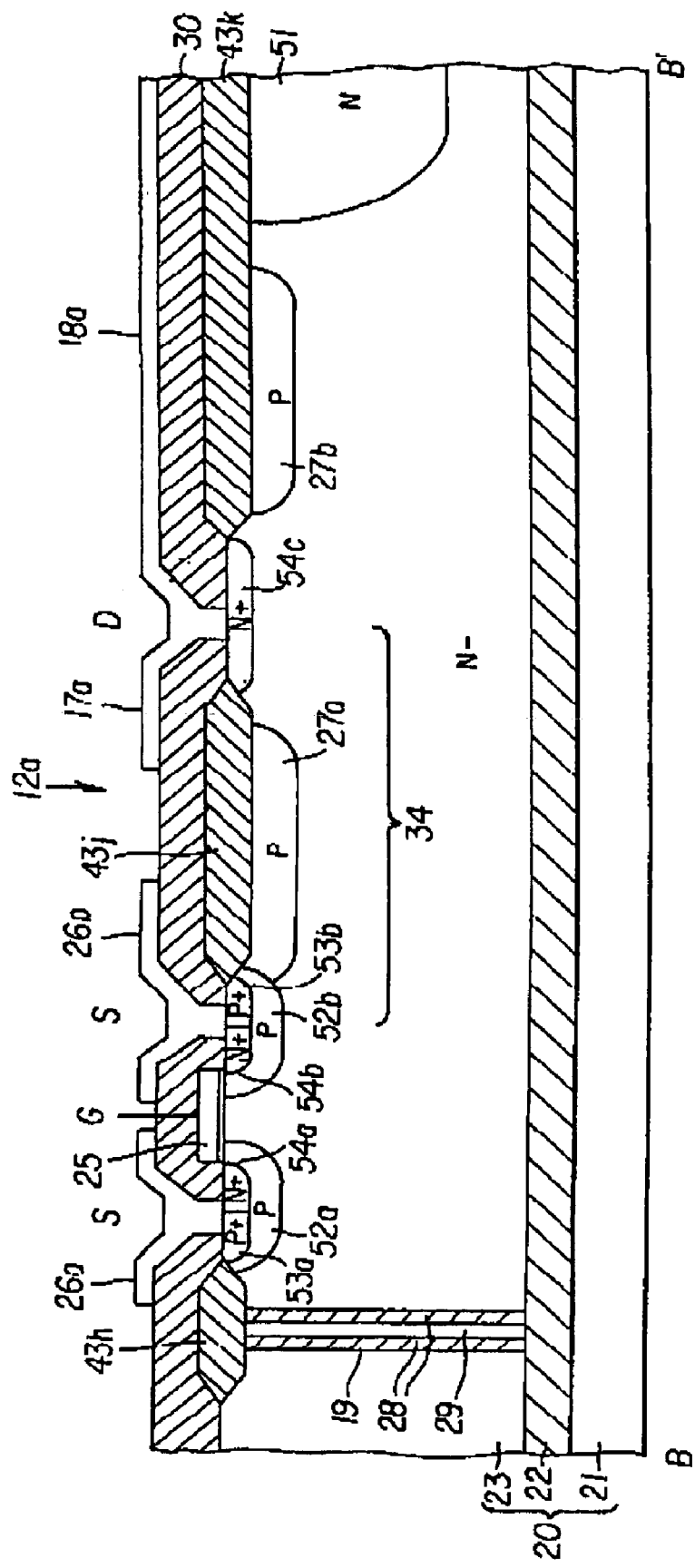
FIG. 3 is a vertical cross sectional view showing a cross sectional structure taken on line B–B' in FIG. 1.

FIG. 3 is a vertical cross sectional view taken on line B–B' in FIG. 1, and shows a cross sectional structure of high breakdown voltage NMOSFET 12a. As shown in FIG. 3, on the inside of high breakdown voltage junction terminating structure 34, N+-drain region 54c is formed. Drain electrode 17a, an output electrode that outputs a voltage after a level shift of high breakdown voltage NMOSFET 12a, is electrically connected to N+-drain region 54c. P-well regions 52a and 52b are formed on the outside of high breakdown voltage junction terminating structure 34. Gate electrode 25 is provided on the substrate surface between P-well regions 52a and 52b with a gate insulator film (not shown) in between electrode 25 and the substrate surface.

P+-contact region 53a and N+-source region 54a are formed on the surface of P-well region 52a, and P+-contact region 53b and N+-source region 54b are formed on the surface of P-well region 52b. Source electrode 26a of high breakdown voltage NMOSFET 12a, which is an input electrode to which a voltage before the level shift is inputted, is electrically connected to N+-source regions 54a and P+-contact regions 53a. Source electrode 26b of high breakdown voltage NMOSFET 12a, which is an input electrode to which a voltage before the level shift is also inputted, is electrically connected to N+-source regions 54b and P+-contact regions 53b. P-diffused layer 27a is provided under thermal oxide film 43j provided on the substrate surface of high breakdown voltage junction terminating structure 34 to achieve a high breakdown voltage by the RESURF effect.

Moreover, also under thermal oxide film 43k, provided on the substrate surface under wire 18a that is lead to driving circuit 16 from drain electrode 17a, P-diffused layer 27b is provided. Iinterlayer insulator film 30 is provided between wire 18a and thermal oxide layer 43k. On the side opposite to high breakdown voltage NMOSFET 12a with P-diffused layer 27b in between, N-well layer 51 is provided for forming thereon elements such as driving circuit 16 for the upper arm of the U-phase and output stage element 15. Thermal oxide film 43h is provided on trench isolation region 19.

An explanation will be given about a method of forming high breakdown voltage NMOSFET 12a arranged as shown in FIG. 3. First, N-well layer 51 is formed on the surface layer of an element forming region of second semiconductor substrate 23. Then, P-diffused layers 27a and 27b are formed, which is followed by formation of P-well regions 52a and 52b. Next, thermal oxide films 43h, 43j and 43k are formed on the surface of second semiconductor substrate 23. Moreover, a gate insulator film (not shown) is formed on P-well regions 52a and 52b. Gate electrode 25 made of polycrystalline silicon is formed on the gate insulator film.

Following this, P+-contact regions 53a and 53b are formed, which is followed by formation of N+-source regions 54a and 54b and N+-drain region 54c. Then, after interlayer insulator film 30 of a material such as BPSG is formed on the surface, openings are provided in interlayer insulator film 30 for allowing contact with the semiconductor substrate. In FIG. 3, interlayer insulator film 30 is shown with a part thereof being omitted. Moreover, source electrode 26a and 26b and drain electrode 17a are formed. Along with this, wire 18a is formed, by which high breakdown voltage NMOSFET 12a is completed.

Figure 4:
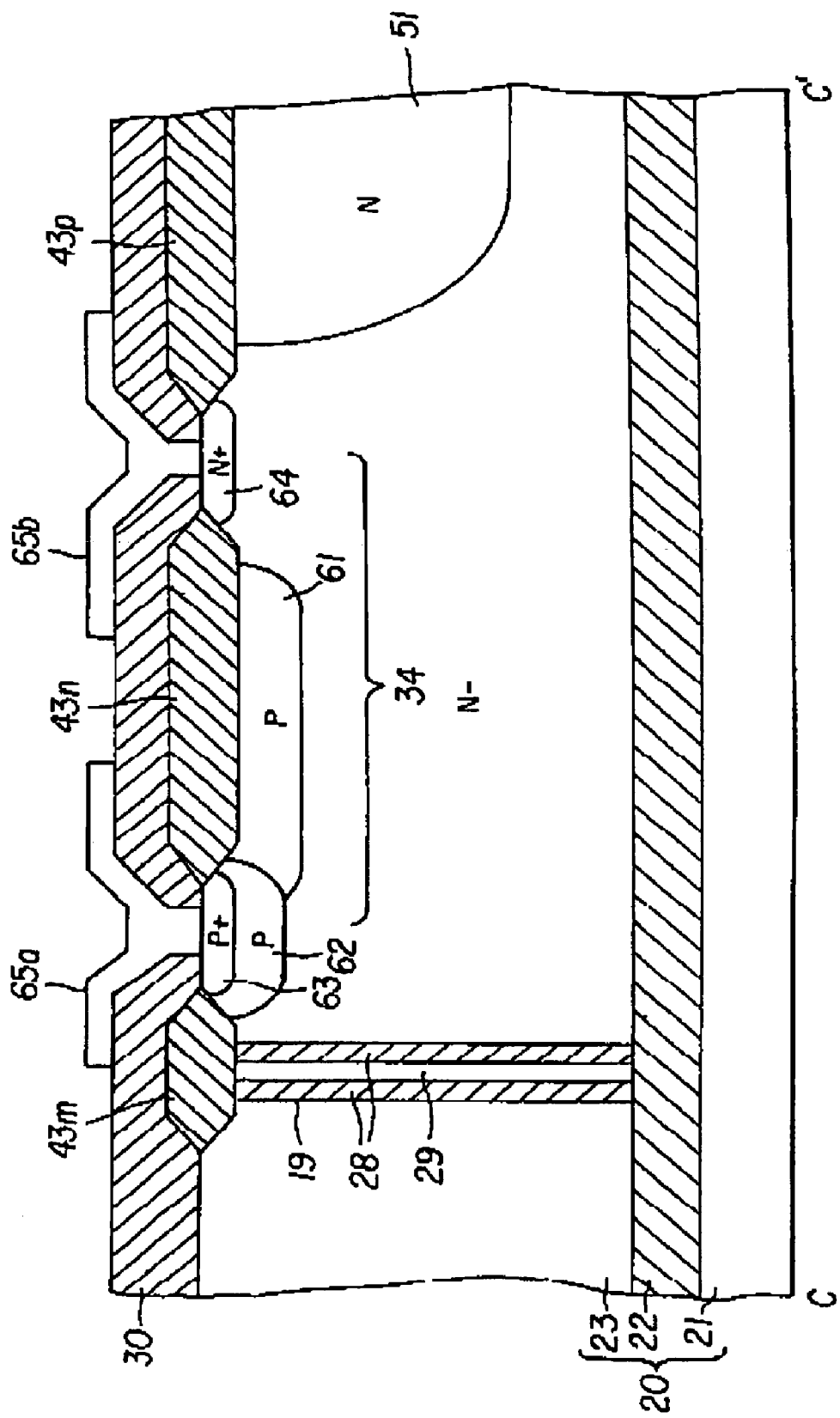
FIG. 4 is a vertical cross sectional view showing a cross sectional structure taken on line C–C' in FIG. 1.

FIG. 4 is a vertical cross sectional view taken on line C–C' in FIG. 1, and shows a cross sectional structure of high breakdown voltage terminating structure 34. As shown in FIG. 4, for achieving a high breakdown voltage by the RESURF effect, P-diffused layer 61 is provided under thermal oxide film 43n provided on the substrate surface of the high breakdown voltage junction terminating structure 34. P-well region 62 is formed between high breakdown voltage junction terminating structure 34 and trench isolation region 19 as the second insulation region. P+-contact region 63 is formed on the surface of the P-well region 62. Metal electrode 65a is electrically in contact with P+-contact region 63.

N-well layer 51 is provided in the inside region of high breakdown voltage junction terminating structure 34. N+-contact region 64 is provided on the substrate surface between high breakdown voltage junction terminating structure 34 and N-well layer 51. Metal electrode 65b is electrically in contact with N+-contact region 64. Thermal oxide film 43p is provided on the surface of N-well layer 51. Moreover, thermal oxide film 43m also is provided also on trench isolation region 19.

An explanation will be given about a method of forming high breakdown voltage junction terminating structure 34 arranged as shown in FIG. 4. First, N-well layer 51 is formed on the surface layer of the element forming region of second semiconductor substrate 23. Then, P-diffused layer 61 is formed and P-well region 62 is formed. Next, thermal oxide films 43m, 43n and 43p are formed on the surface of second semiconductor substrate 23. Moreover, P+-contact region 63 is formed, which is followed by formation of N+-contact region 64. Next to this, after the interlayer insulator film (not shown) of a material such as BPSG is formed on the surface, openings are provided in the interlayer insulator film for allowing contact with the semiconductor substrate and metal electrodes 65a and 65b are formed in the respective openings, by which the high breakdown voltage junction terminating structure 34 is completed.

According to the above-explained embodiment 1, by adopting the self-shield structure, each of wires 18a and 18b connected to drain electrodes 17a and 17b, respectively, only traverse over the substrate at an electric potential level equal to the reference electric potential level of the upper arm. Therefore, there is no necessity to particularly thicken interlayer insulator film 30 between the substrate and each of wires 18a and 18b. A thickness of the order of 1 to 5 µm is enough for interlayer insulator film 30. This can bring a one-chip inverter with a high breakdown voltage exceeding 1000V into realization at low cost. Furthermore, miniaturization of an inverter system can be achieved.

Moreover, according to the above-explained embodiment 1, lateral IGBT 13 and lateral FWD 14 are shielded by oxide film 22 in SOI substrate 20 and oxide film 28 in trench isolation region 19, so that an operation of a parasitic element can be prevented. Furthermore, high breakdown voltage junction terminating structure 34 is surrounded by trench isolation region 19 to thereby also prevent the operation of the parasitic elements. Therefore, damage and malfunction of a one-chip inverter can be prevented, by which a high reliable one-chip inverter can be obtained.

Embodiment 2

Figure 5:
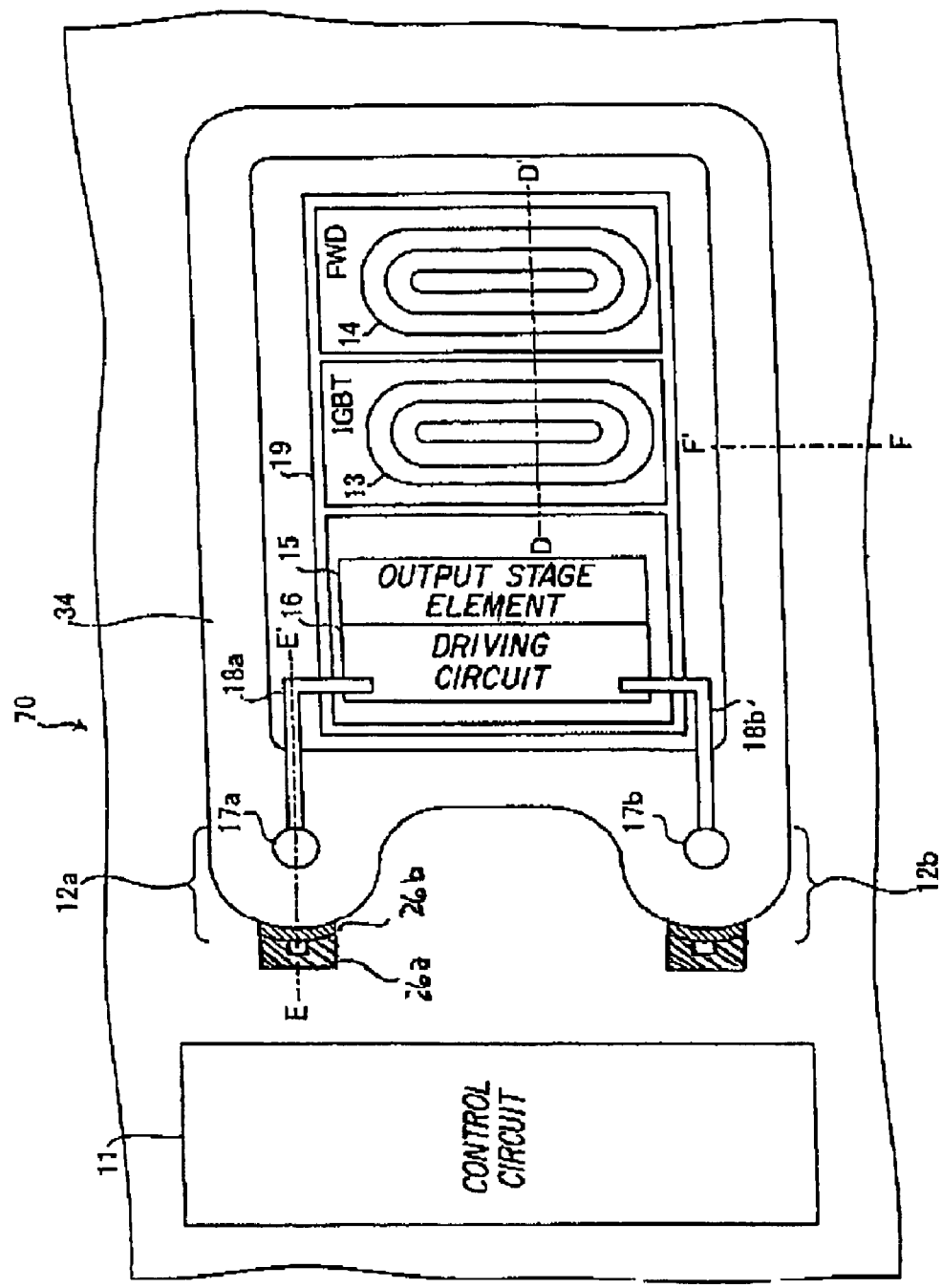
FIG. 5 is a plan view schematically showing an arrangement of a principal part for an upper arm of the U-phase in a one-chip inverter according to embodiment 2 of the invention.
Figure 6:
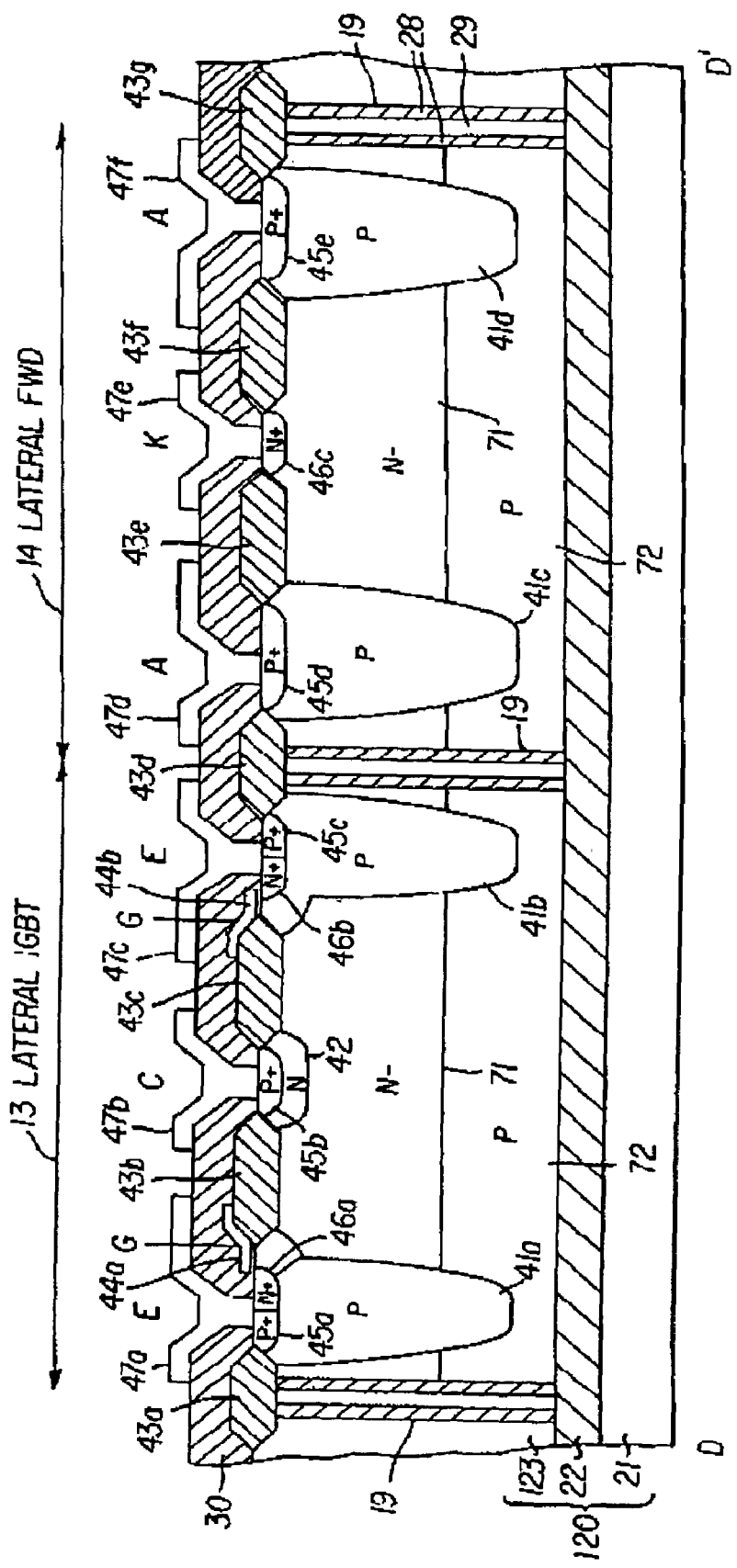
FIG. 6 is a vertical cross sectional view showing a cross sectional structure taken on line D–D' in FIG. 5.
Figure 7:
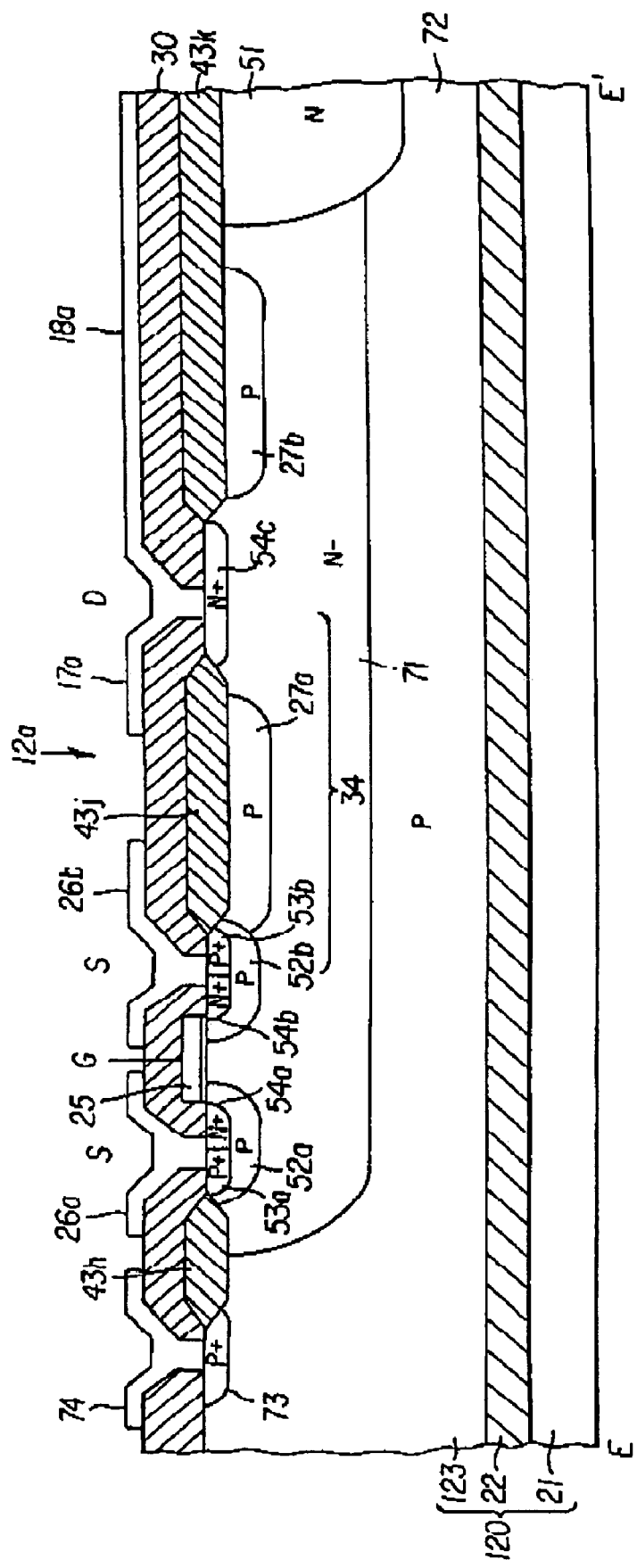
FIG. 7 is a vertical cross sectional view showing a cross sectional structure taken on line E–E' in FIG. 5.
Figure 8:
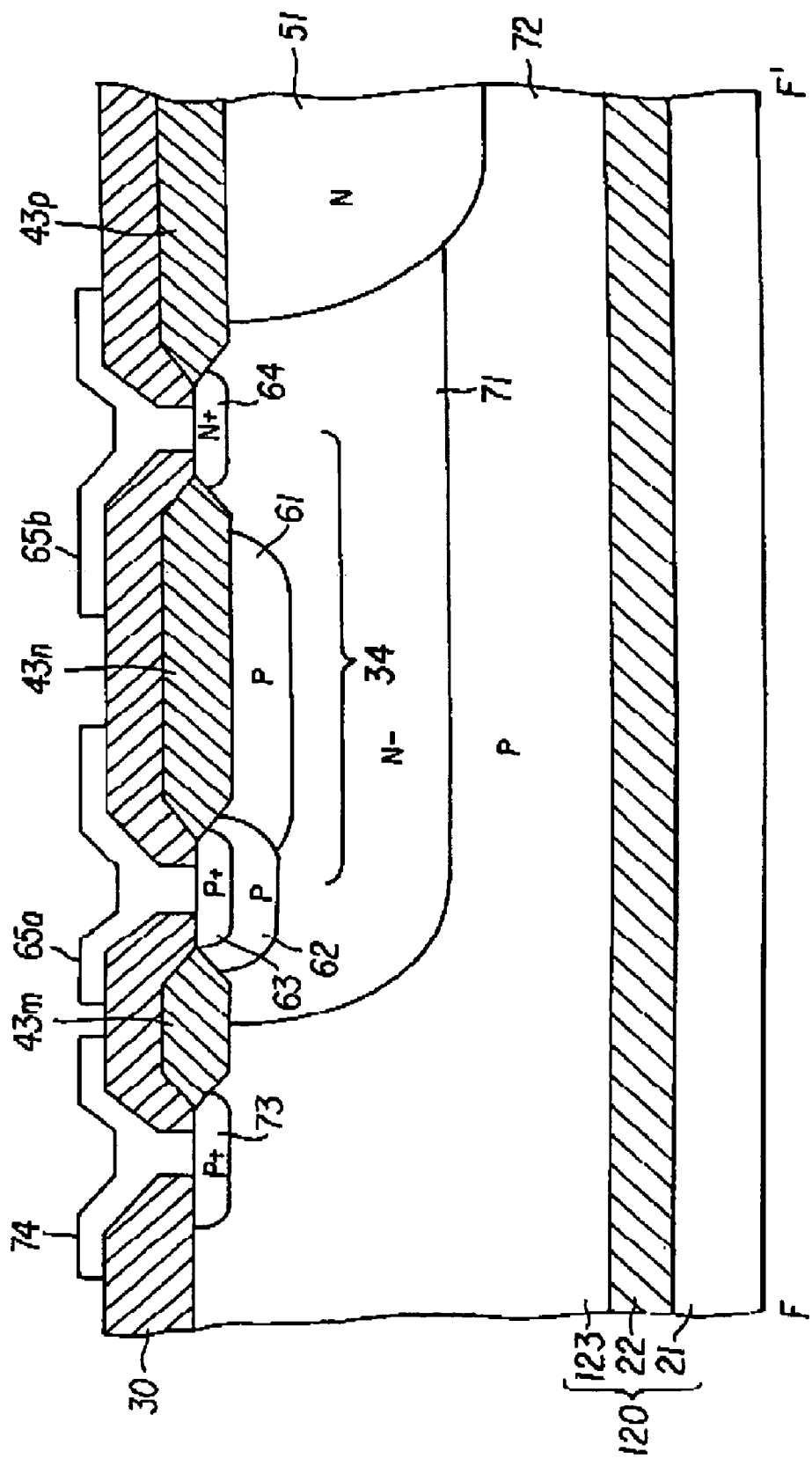
FIG. 8 is a vertical cross sectional view showing a cross sectional structure taken on line F–F' in FIG. 5.
Figure 9:
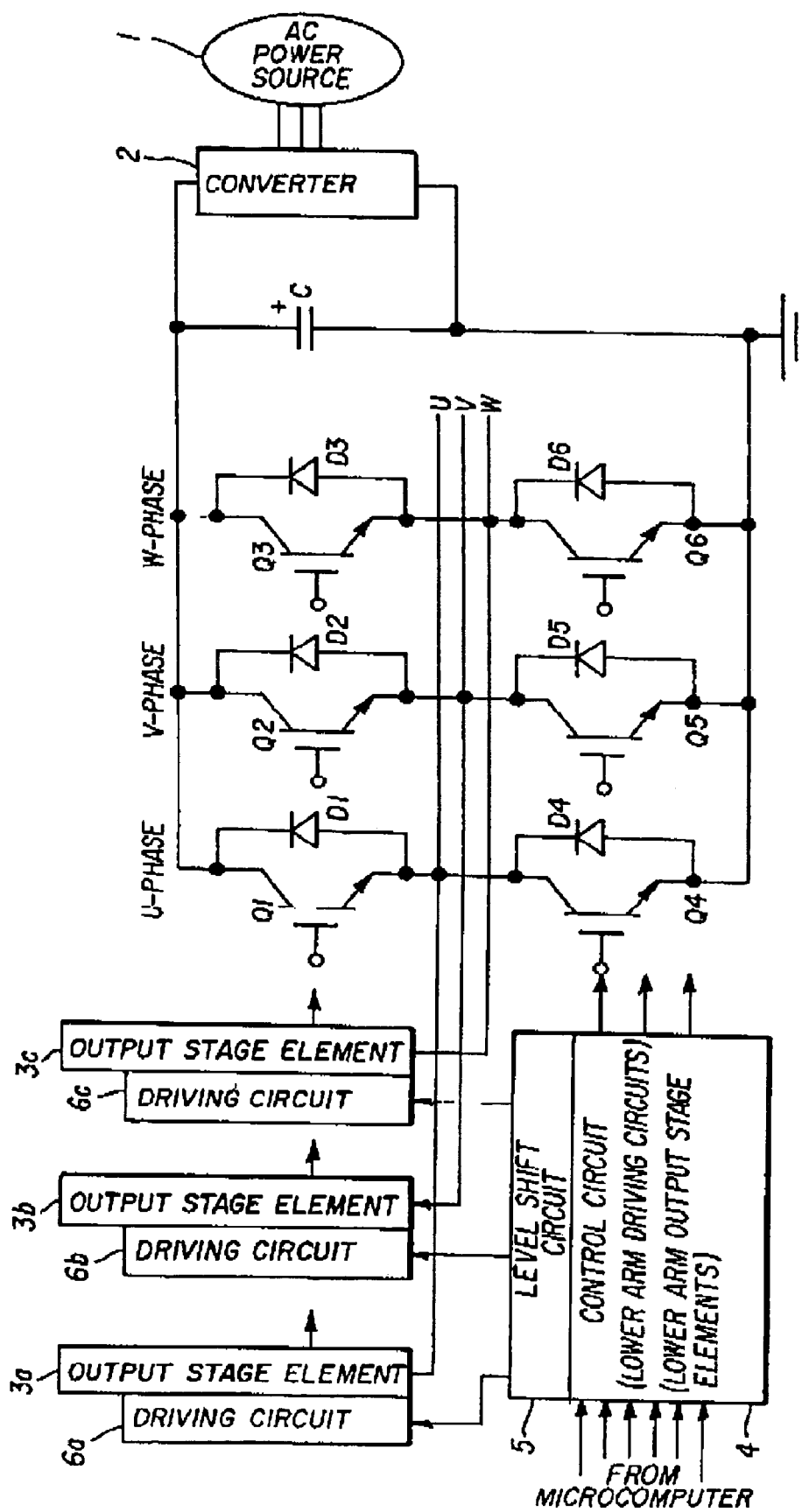
FIG. 9 is a circuit diagram showing an arrangement of a general inverter circuit.
Figure 10:
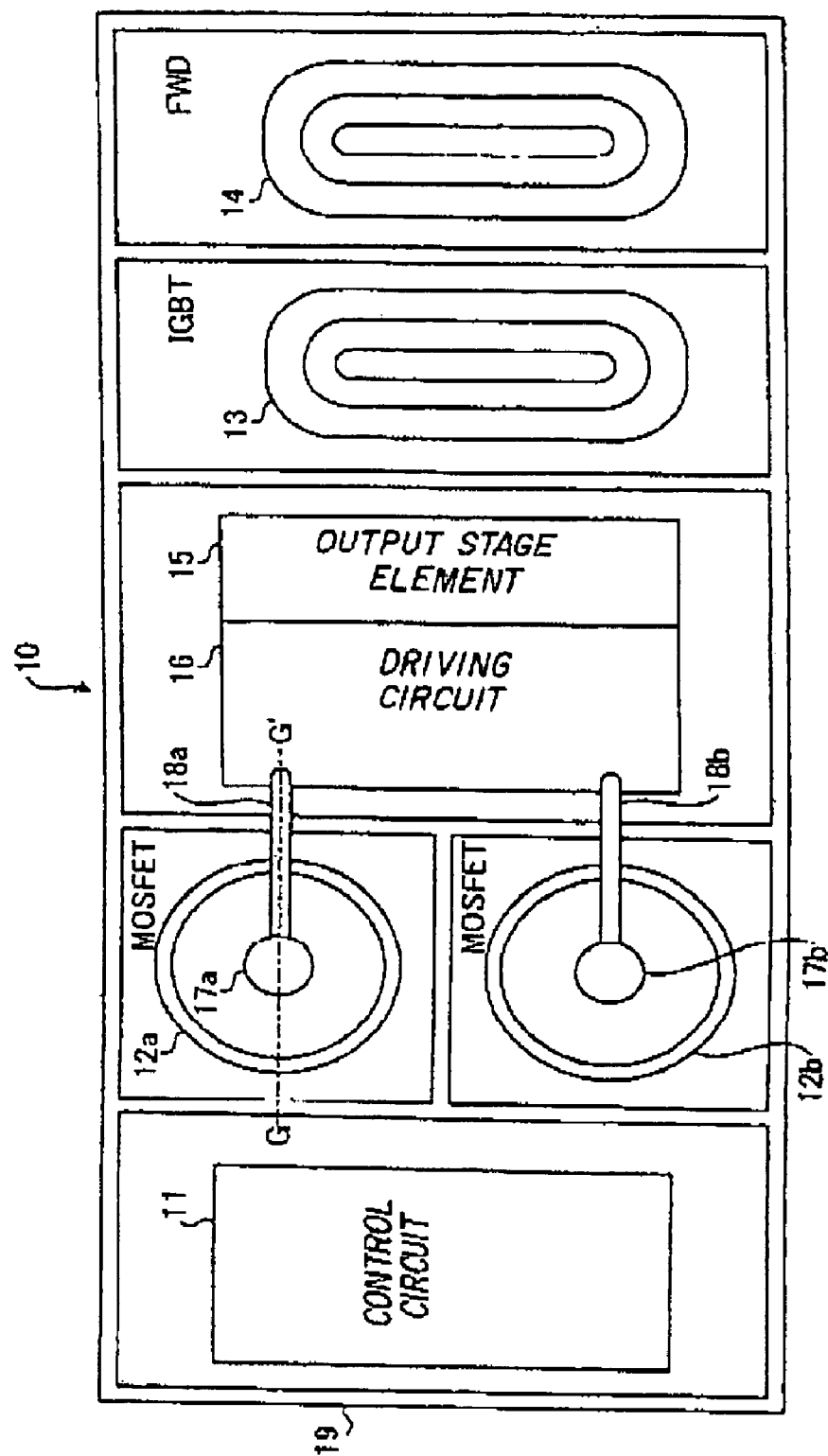
FIG. 10 is a plan view schematically showing an arrangement of a principal part for an upper arm of the U-phase in a related one-chip inverter.
Figure 11:
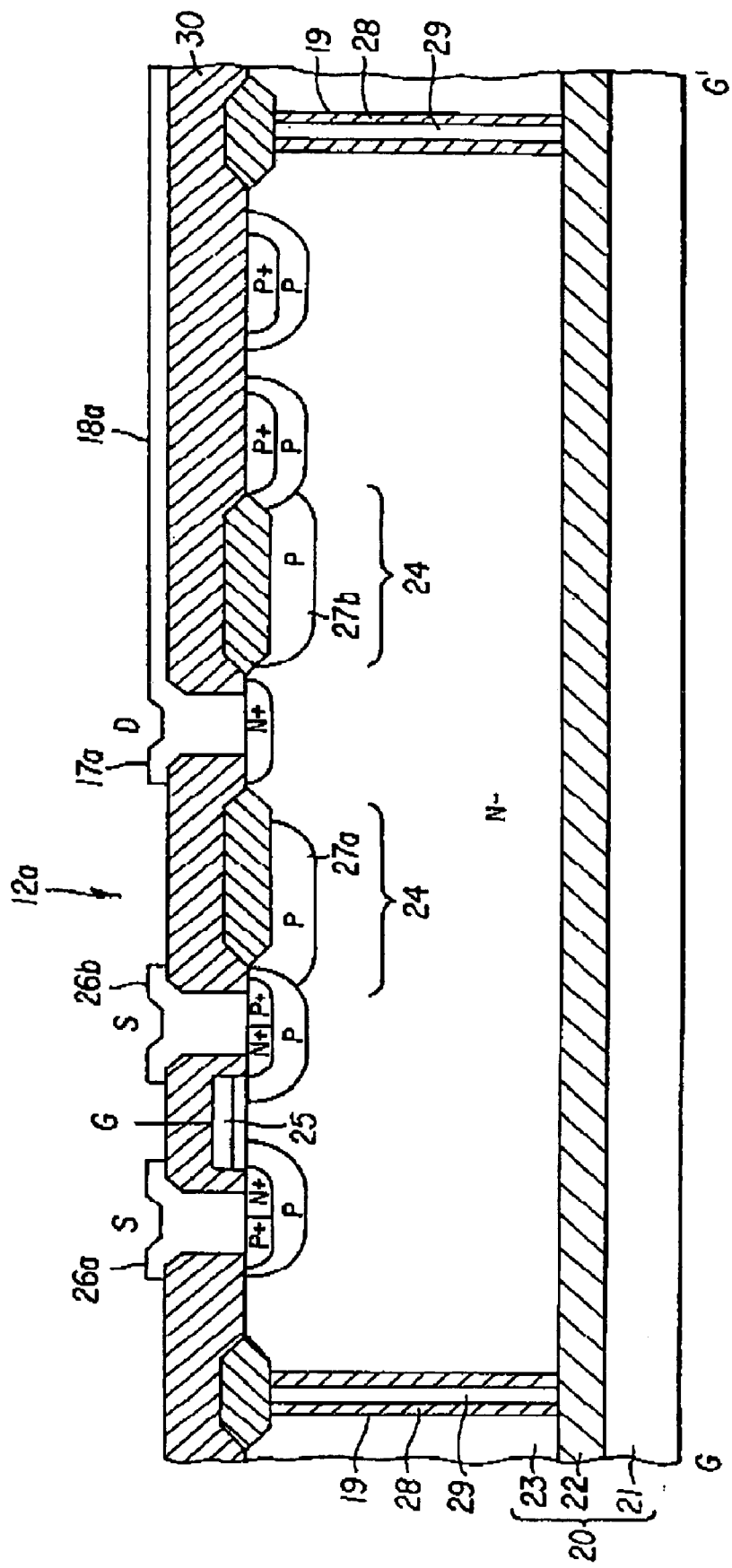
FIG. 11 is a vertical cross sectional view showing a cross sectional structure taken on line G–G' in FIG. 10.
Figure 12:
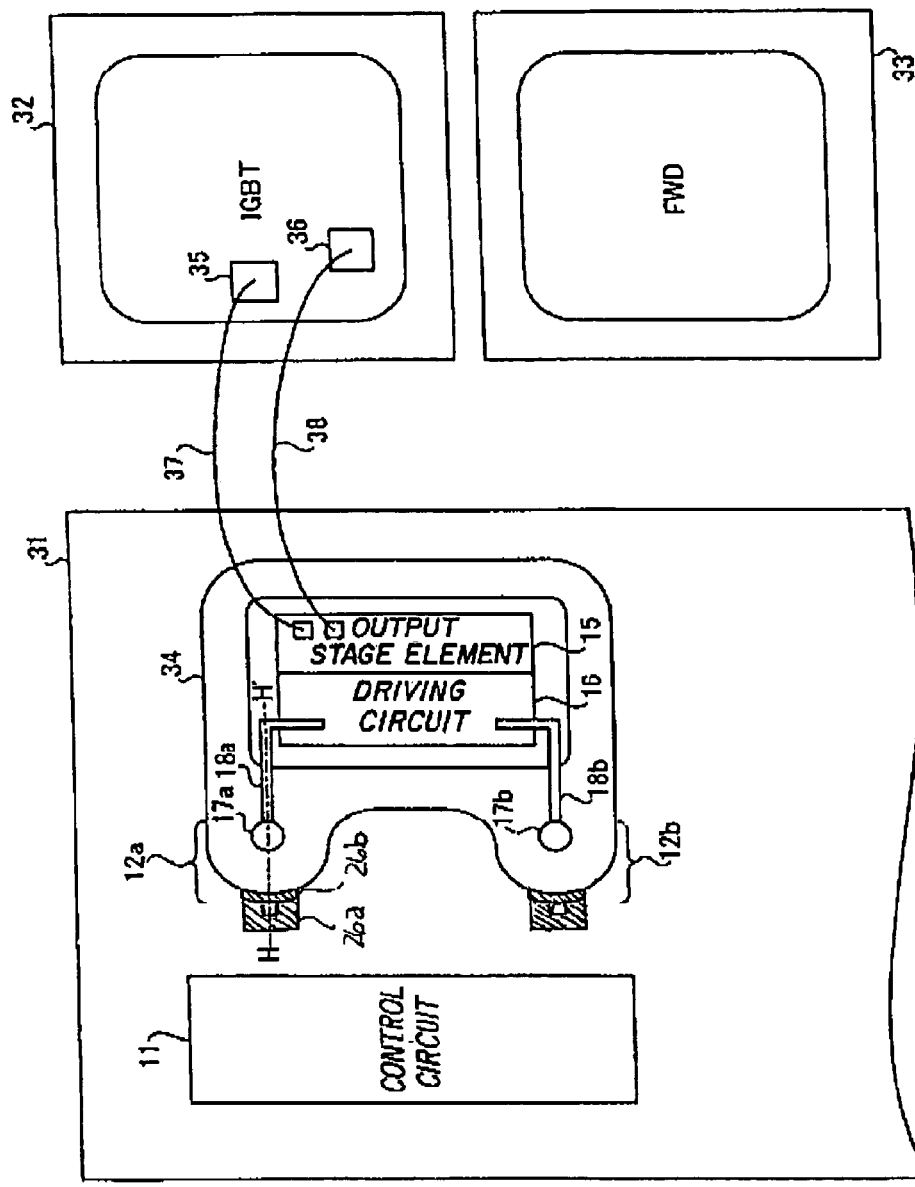
FIG. 12 is a plan view schematically showing an arrangement of a principal part for an upper arm of the U-phase in a related inverter device with a multi-chip arrangement.
Figure 13:
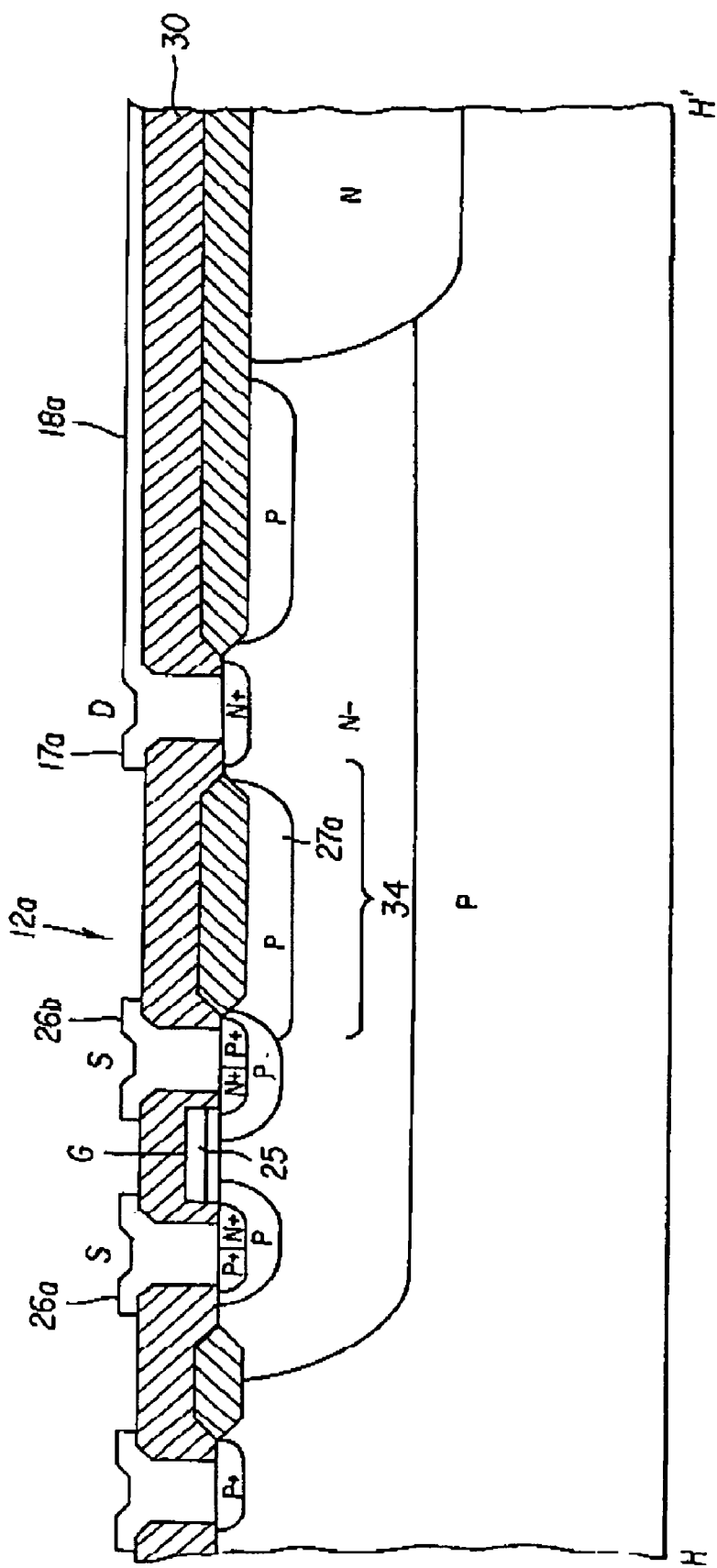
FIG. 13 is a vertical cross sectional view showing a cross sectional structure taken on line H–H' in FIG. 12.

FIG. 5 is a plan view schematically showing an arrangement of a principal part for the upper arm of the U-phase in a one-chip inverter according to embodiment 2 of the invention. FIG. 6, FIG. 7 and FIG. 8 are vertical cross sectional views taken on lines D–D', E–E' and F–F' in FIG. 5, respectively. In embodiment 2, the same constituents as those shown in FIG. 1 to FIG. 4 are designated by the same reference numerals and signs with repetition of explanation thereof being omitted.

As shown in FIG. 5, in one-chip inverter (the part for the upper arm of the U-phase) 70 of embodiment 2, high breakdown voltage junction terminating structure 34 is surrounded by no trench isolation region 19. While, in the inside region of high breakdown voltage junction terminating structure 34, both of output stage element 15 and driving circuit 16 are also surrounded by trench isolation region 19.

Moreover, as shown in FIG. 6 to FIG. 8, as a SOI substrate, SOI substrate 120 is used in which oxide film 22 is layered on first semiconductor substrate 21 with a P-type second semiconductor substrate 123 further laminated thereon. Therefore, an N-layer 71 is formed on the surface layer of the second semiconductor substrate 123. High breakdown voltage NMOSFETs 12a and 12b, lateral IGBT 13, lateral FWD 14 and high breakdown voltage junction terminating structure 34 are formed on the surface side of N-layer 71. The other arrangements are the same as those in embodiment 1.

In FIG. 6, cross sectional structures of lateral IGBT 13 and lateral FWD 14 in embodiment 2 are shown. As shown in FIG. 6, trench isolation region 19 penetrates second semiconductor substrate 123 of SOI substrate 120 to reach oxide film 22 of SOI substrate 120. Lateral IGBT 13 and lateral FWD 14 are formed in the IGBT forming regions and the FWD forming region, respectively, each being surrounded by trench isolation region 19 and oxide film 22 of SOI substrate 120.

P-well regions 41a and 41b penetrate the N-layer 71 in the IGBT forming region to reach the lower part (hereinafter referred to as P-layer 72) of N-layer 71 in second semiconductor substrate 123. Moreover, P-diffused regions 41c and 41d in the FWD forming region also penetrate N-layer 71 to reach P-layer 72.

The other structures of lateral IGBT 13 and lateral FWD 14 are the same as those shown in FIG. 2. The method of forming each of lateral IGBT 13 and lateral FWD 14 with structures shown in FIG. 6 is that of only adding the step of forming N-layer 71 to the method as explained for embodiment 1.

In FIG. 7, the cross sectional structure of high breakdown voltage NMOSFET 12a is shown. Moreover, in FIG. 8, a cross sectional structure of high breakdown voltage terminating structure 34 is shown. As shown in FIG. 7 and FIG. 8, no trench isolation region is provided on the outside of high breakdown voltage terminating structure 34. Each of the terminating sections of NMOSFET 12a and terminating structure 34 is formed with a P-N junction of the P-layer 72 and the N-layer 71. P+-contact region 73 is provided on the surface on the outside of the terminating section to provide contact with P-layer 72. A metal electrode 74 is electrically connected to P+-contact region 73.

The other structures of high breakdown voltage NMOSFET 12a and high breakdown voltage terminating structure 34 are the same as those shown in FIG. 3 and FIG. 4. The method of forming each of high breakdown voltage NMOSFET 12a with the structure shown in FIG. 7 and high breakdown voltage terminating structure 34 shown in FIG. 8 necessitates only to add the step of forming N-layer 71 to the method as explained for embodiment 1 and, along with this, to form P+-contact region 73 at the same time that P+-contact regions 53a, 53b and 63 are formed. In addition to this, it is necessary only to form metal electrode 74 at the same time that source electrodes 26a and 26b, drain electrode 17a and metal electrodes 65a and 65b are formed.

According to the above-explained embodiment 2 an additional effect to that displayed by embodiment 1 can be obtained. Embodiment 1 has a disadvantage in that the long distance of high breakdown voltage terminating structure 34 requires that more area be provided for trench isolation region 19 (the second insulation region) along the perimeter of terminating structure 34. Moreover, crystalline defects sometimes occur around trench isolation region 19 to make it impossible to form devices near trench isolation region 19 in embodiment 1.

In this situation, when a trench isolation region is provided around high breakdown voltage terminating structure 34 as in embodiment 1, in spite of an increase in chip area, an effective area occupied by a device thereto becomes small. That is, the chip has to become large. Compared with this, without the trench isolation region provided on the outside of high breakdown voltage terminating structure 34 as in embodiment 2, a chip can be miniaturized.

Moreover, according to embodiment 2, output stage element 15 and driving circuit 16 are surrounded by trench isolation region 19. This can prevent operations of parasitic elements (such as latch-up) occurring between the elements, forming output stage element 15 and driving circuit 16, and the elements forming those such as control circuit 11 on the outside of high breakdown voltage junction terminating structure 34 and taking the ground (GND) level as the reference electric potential thereof.

Furthermore, according to embodiment 2, a high voltage, when applied between collector electrode 47b and each of emitter electrodes 47a and 47c of lateral IGBT 13, makes a depletion layer spread not only between N-layer 71 and each of P-well regions 41a and 41b but also between N-layer 71 and P-layer 72 to hardly cause an electric field concentration. Moreover, also with a high voltage, applied between cathode electrode 47e and each of anode electrodes 47d and 47f of lateral FWD 14, a depletion layer is made spread not only between N-layer 71 and each of P-diffused regions 41c and 41d but also between N-layer 71 and P-layer 72 to hardly cause an electric field concentration. Therefore, even though a length of high breakdown voltage terminating structure 34 is short, the chip can be easily made to provide a high breakdown voltage.

In addition, according to embodiment 2, also about the high breakdown voltage terminating structure 34, similar addition of the P—N junction of P-layer 72 and N-layer 71 thereto can easily make high breakdown voltage terminating structure 34 provide a high breakdown voltage even though the length of high breakdown voltage terminating structure 34 is short.

In the foregoing, the invention is not limited to the above-explained embodiments but can be variously modified. For example, as the level shift element, an element, in which a high breakdown voltage PMOSFET for a level down circuit for outputting sensing signals is added to the high breakdown voltage NMOSFET for a level-up circuit for driving an upper arm IGBT, can be provided so as to spread over the inside and the outside of the high breakdown voltage junction terminating structure 34. Furthermore, an arrangement can be provided in which conduction types of the semiconductor layer and semiconductor regions in the embodiments are reversed.

Moreover, the power elements are not limited to the IGBT and the FWD, and structures of the IGBT and the FWD are also not limited to those in the above-explained embodiments. Furthermore, the location of arranging trench isolation region 19 can be varied as necessary as long as an operation of a parasitic element can be prevented. In addition, besides the three-phase one-chip inverter, the invention can be applied to a semiconductor device in which power elements and its driving circuits and control circuits are integrated into one chip.

Thus a semiconductor device according to the present invention is useful as a semiconductor device in which power elements and its driving circuits and control circuits are integrated into one chip, and especially it is appropriate for a semiconductor device comprising one-chip inverter.

According to the invention, there is no necessity of providing a thick interlayer insulator film under a high electric potential wire connecting a level shift element and a driving unit, which makes it possible to obtain a high breakdown voltage semiconductor device. Moreover, an operation of a parasitic element can be prevented to allow obtaining a semiconductor device that hardly causes damages and malfunctions.

Thus, a semiconductor device has been described according to the present invention. Many modifications and variations may be made to the techniques and structures described and illustrated herein without departing from the spirit and scope of the invention. Accordingly, it should be understood that the device described herein is illustrative only and not limiting upon the scope of the invention.

What is claimed is:

1. A semiconductor device comprising:
   a supporting substrate;
   an insulator layer layered on the supporting substrate;
   a semiconductor layer layered on the insulator layer;
   a high breakdown voltage junction terminating structure having a RESURF (reduced surface field) structure formed in a loop-like shape on a surface region of the semiconductor layer;
   a power element formed in a region surrounded by the high breakdown voltage junction terminating structure;
   a driving unit for the power element formed in the region surrounded by the high breakdown voltage junction terminating structure;
   an insulation region surrounding the power element in the region surrounded by the high breakdown voltage junction terminating structure and penetrating through the semiconductor layer to reach the insulator layer;
   a level shift element having an input electrode, in which a voltage before level shift is applied, and an output electrode, to which a voltage after level shift is applied, the input electrode being disposed on one side of the high breakdown voltage junction terminating structure and the output electrode being disposed on the other side of the high breakdown voltage junction terminating structure with the high breakdown voltage junction terminating structure positioned between the input electrode and the output electrode;
   a wire electrically connecting the output electrode of the level shift element and the driving unit; and
   an interlayer insulator film provided between the semiconductor layer and the wire
   wherein the power element comprises one of an insulated gate bipolar transistor and a diode.

2. The semiconductor device as claimed in claim 1, wherein the driving unit is positioned between the high breakdown voltage junction terminating structure and the insulation region.

3. The semiconductor device as claimed in claim 1, further comprising a second insulation region surrounding the high breakdown voltage junction terminating structure and penetrating through the semiconductor layer to reach the insulator layer.

4. The semiconductor device as claimed in claim 1, wherein the driving unit is surrounded by the insulation region.

5. The semiconductor device as claimed in claim 1, wherein the level shift element is made up of a high breakdown voltage insulated gate field-effect transistor having a drain electrode as the output electrode on one side of the high breakdown voltage junction terminating structure, and a gate electrode and a source electrode as the input electrode on the other side, with the high breakdown voltage junction terminating structure positioned between the drain electrode and both of the gate electrode and the source electrode.

6. The semiconductor device as claimed in claim 1, wherein the power element comprises both an insulated gate bipolar transistor and a diode.

7. The semiconductor device as claimed in claim 1, wherein the driving unit is one of an N-channel insulated gate field-effect transistor and a P-channel insulated gate field-effect transistor.

8. A semiconductor device comprising:
   a supporting substrate;
   an insulator layer layered on the supporting substrate;
   a semiconductor layer layered on the insulator layer;
   a high breakdown voltage junction terminating structure having a RESURF (reduced surface field) structure formed in a loop-like shape on a surface region of the semiconductor layer;
   a power element formed in a region surrounded by the high breakdown voltage junction terminating structure;
   a driving unit for the power element formed in the region surrounded by the high breakdown voltage junction terminating structure, wherein the driving unit comprises both an N-channel insulated gate field-effect transistor and a P-channel insulated gate field-effect transistor;
   an insulation region surrounding the power element in the region surrounded by the high breakdown voltage junction terminating structure and penetrating through the semiconductor layer to reach the insulator layer;

a level shift element having an input electrode, to which a voltage before level shift is applied, and an output electrode, to which a voltage after level shift is applied, the input electrode being disposed on one side of the high breakdown voltage junction terminating structure and the output electrode being disposed on the other side of the high breakdown voltage junction terminating structure with the high breakdown voltage junction terminating structure positioned between the input electrode and the output electrode;

a wire electrically connecting the output electrode of the level shift element and the driving unit; and an interlayer insulator film provided between the semiconductor layer and the wire.

9. A semiconductor device comprising:

a supporting substrate;

an insulator layer layered on the supporting substrate;

a semiconductor layer layered on the insulator layer;

a high breakdown voltage junction terminating structure having a RESURF (reduced surface field) structure formed in a loop-like shape on a surface region of the semiconductor layer;

a power element formed in a region surrounded by the high breakdown voltage junction terminating structure;

a driving unit for the power element formed in the region surrounded by the high breakdown voltage junction terminating structure, wherein the driving unit is one of an N-channel insulated gate field-effect transistor and a P-channel insulated gate field-effect transistor;

an insulation region surrounding the power element in the region surrounded by the high breakdown voltage junction terminating structure and penetrating through the semiconductor layer to reach the insulator layer;

a level shift element having an input electrode, to which a voltage before level shift is applied, and an output electrode, to which a voltage after level shift is applied, the input electrode being disposed on one side of the high breakdown voltage junction terminating structure and the output electrode being disposed on the other side of the high breakdown voltage junction terminating structure with the high breakdown voltage junction terminating structure positioned between the input electrode and the output electrode;

a wire electrically connecting the output electrode of the level shift element and the driving unit;

an interlayer insulator film provided between the semiconductor layer and the wire; and a logic element in an outer region of the high breakdown voltage junction terminating structure on the semiconductor layer.

10. The semiconductor device as claimed in clam 9, wherein the logic element comprises one of an N-channel insulated gate field-effect transistor and a P-channel insulated gate field-effect transistor.

11. The semiconductor device as claimed in claim 9, wherein the logic element comprises both an N-channel insulated gate field-effect transistor and a P-channel insulated gate field-effect transistor.

12. A semiconductor device comprising:

supporting substrate;

an insulator layer layered on the supporting substrate;

a semiconductor layer layered on the insulator layer;

a high breakdown voltage junction terminating structure having a RESURF (reduced surface field) structure formed in a loop-like shape on a surface region of the semiconductor layer;

a power element formed in a region surrounded by the high breakdown voltage junction terminating structure;

a driving unit for the power element formed in the region surrounded by the high breakdown voltage junction terminating structure;

an insulation region surrounding the power element in the region surrounded by the high breakdown voltage junction terminating structure and penetrating through the semiconductor layer to reach the insulator layer;

a level shift element having an input electrode, to which a voltage before level shift is applied, and an output electrode, to which a voltage after level shift is applied, the input electrode being disposed on one side of the high breakdown voltage junction terminating structure and the output electrode being disposed on the other side of the high breakdown voltage junction terminating structure with the high breakdown voltage junction terminating structure positioned between the input electrode and the output electrode;

a wire electrically connecting the output electrode of the level shift element and the driving unit; and an interlayer insulator film provided between the semiconductor layer and the wire wherein a second semiconductor layer is formed on the semiconductor layer between the input electrode and the output electrode, and the input electrode and the output electrode are extended over the second semiconductor layer and are used both as a field plate of the level shift element and electrodes.

* * * * *